Aug. 20, 1968 C. A. BITTMANN ET AL 3,397,450

METHOD OF FORMING A METAL RECTIFYING CONTACT TO SEMICONDUCTOR MATERIAL BY DISPLACEMENT PLATING

Original Filed Jan. 31, 1964 3 Sheets-Sheet 1

INVENTORS
CHARLES A. BITTMANN
CHIH-TANG SAH

BY Roger S. Borovoy
Norman M. Kinsey(?)
ATTORNEYS

INVENTORS
CHARLES A. BITTMANN
CHIH-TANG SAH
BY [signatures]
ATTORNEYS

INVENTORS
CHARLES A. BITTMANN
CHIH-TANG SAH

BY Roger L. Bo[illegible]
Norman N. [illegible]
ATTORNEYS

United States Patent Office 3,397,450

Patented Aug. 20, 1968

3,397,450

METHOD OF FORMING A METAL RECTIFYING CONTACT TO SEMICONDUCTOR MATERIAL BY DISPLACEMENT PLATING

Charles A. Bittmann, Los Altos, and Chih-Tang Sah, Mountain View, Calif., asisgnors to Fairchild Camera and Instrument Corporation, Syosset, N.Y., a corporation of Delaware Original application Jan. 31, 1964, Ser. No. 341,717. Divided and this application May 26, 1966, Ser. No. 570,101

3 Claims. (Cl. 29—578)

ABSTRACT OF THE DISCLOSURE

A method of forming a metal rectifying contact to a semiconductor material by exposing the surface of the semiconductor material through an oxide mask to an etching solution to which the mask is resistant. The solution contains ions of the metal to be used for contact. The etching solution removes the oxides from the unmasked portion of the surface and the metal ions therein replace some of the semiconductor material exposed by the removed oxide, thereby leaving a deposit of metal on the exposed semiconductor material to form a rectifying contact.

Figure 1A:
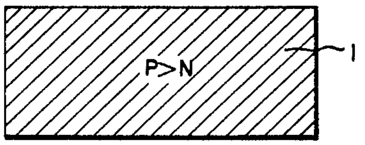
Figure 1B:
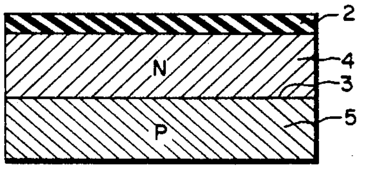
Figure 1C:
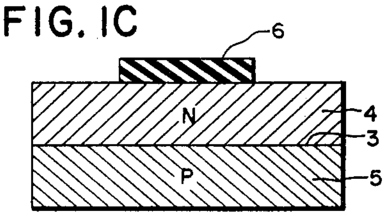

This application is a division of application Ser. No. 341,717, filed Jan. 31, 1964.

This invention relates to an improved high frequency transistor and method of its manufacture; in particular to a transistor having a thin, diffused base region and a metal emitter.

Metal-semiconductor barrier junctions are well known in the art. As exemplified by the devices of U.S. Patent 2,930,949, metal-semiconductor junctions are commonly used as both the emitter-base and base-collector junctions of a transistor. By a process called "jet-electroplating," a shallow underlying aperture or dimple is etched into the wafer surface and then a metal is deposited onto a semiconductor wafer. Two such dimples, each containing a deposited metal dot, oppose each other in opposite surfaces of the wafer, the semiconductor region between them forming the transistor base. Each aperture forms a rectifying junction with the semiconductor material, with the metal dot in one acting as the emitter and the dot in the other acting as the collector.

One requisite of high-frequency transistors is a high maximum oscillation frequency, $f_{max.}$ (the highest frequency at which the transistor can be made to oscillate, under optimum conditions). The $f_{max.}$ of any transistor at a given operating point is therefore the upper boundary of the frequency range over which the transistor is an active device (at that point). At frequencies above $f_{max.}$ the transistor can no longer provide useful gain, since any device with power gain can be made to oscillate by feeding all the available output back to the input with the proper phase. Conversely, if the transistor is able to oscillate at a given frequency, it can also (with suitable circuitry) provide gain at that frequency. Thus it may be seen that the $f_{max.}$ is also the frequency at which the maximum available power gain is 1.

The value of $f_{max.}$ provides a conservative index of transistor capability, since circuit losses and maladjustments can reduce, but never increase, the measured maximum oscillation frequency. The high maximum frequency limits necessitated by resent developments in microwave transistors have been difficult to achieve with the prior-art structure. The base has had to be at least a few microns wide, to provide structural stability and to prevent emitter-to-collector shorting, yet excessive base width contributes greatly to increased carrier transit time in the base, and the $f_{max.}$ is inversely proportional to the square root of the transit time.

Another characteristic of prior art devices which materially increases the base spreading resistance (and so decreases the maximum oscillation frequency) is the very high resistivity of the base region itself (between the metal emitter and the collector). This has been deemed necessary to obtain a high emitter efficiency; it is well known that carriers inject less readily into a heavily-doped region with a high carrier concentration than they do into a lightly-doped region of high resistivity. For improved transistor action and operation, therefore, the prior art has used lightly-doped semiconductor material for the base region.

The transistors of this invention employ an entirely new structure yielding a very high maximum oscillation frequency, rendering them desirable for use as microwave transistors. They use a metal-semiconductor emitter-base junction, and a diffused base-collector junction; owing to the nature of the diffusion process, the diffused base region necessarily has appreciably lower resistivity at the surface where injection occurs than does one formed as in the prior art discussed above. This lower resistivity would be expected to reduce emitter efficiency substantially—even to such an extent as to render the devices impractical—yet it has been surprisingly discovered that such devices are actually superior to their prior-art predecessors in operation. Transistor structures having a very thin diffused base region are thus made possible; the decreased resistivity of the base region combines with the decreased width to yield an appreciable increase in the obtainable $f_{max.}$.

In a preferred embodiment of the invention, a transistor structure is fabricated which has a high resistivity at the surface of the base region (where the emitter is attached), but a much lower resistivity just below this region. Such a configuration, made possible by outdiffusion, provides both the low overall base resistivity which is necessary for a high $f_{max.}$ and the lightly doped semiconductor material immediately underlying the emitter which insures satisfactory injection characteristics.

If desired, the width of the base region underlying the base contact may exceed that under the metal emitter. Such a structure permits a very thin base region under the emitter (assuring a high $f_{max.}$) but provides additional thickness beneath the base contact (which is alloyed to the surface of the semiconductor material). By use of this structure the danger of a contact shorting out the base and collector during the alloying process is considerably lessened.

Additionally, the invention provides a method whereby the metal emitter may be formed during the same step as the aperture within which it is to lie is etched into the oxide coating. When ions of the emitter metal are included in the etching solution, they are displaced in the solution by silicon ions from the semiconductor, thereby causing a dot of displaced metal to precipitate and be deposited in the aperture formed by the etchant. If a thicker or larger contact area is desired, additional metal (emitter or other) may be deposited over the first dot by later evaporation. If the plating metal is properly chosen, a rectifying contact may be formed.

Figure 1D:
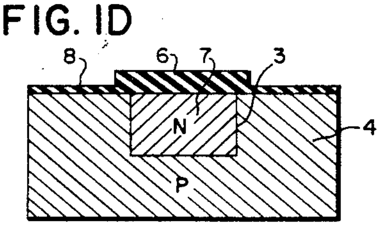
Figure 1E:
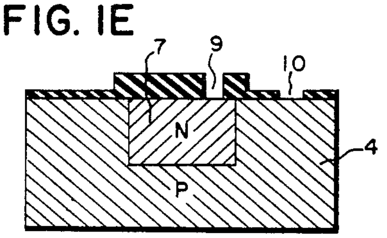
Figure 1F:
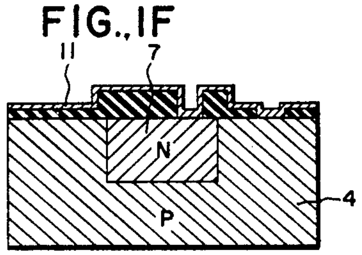
Figure 1G:
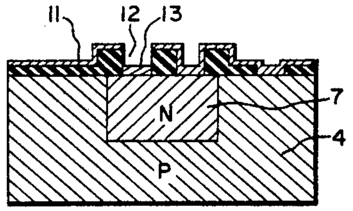
Figure 1H:
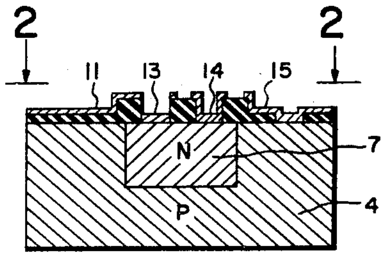
Figure 2:
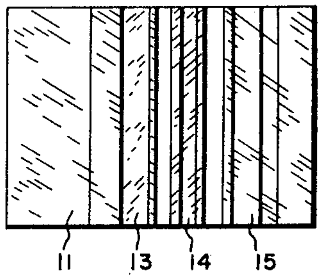
Figure 3A:
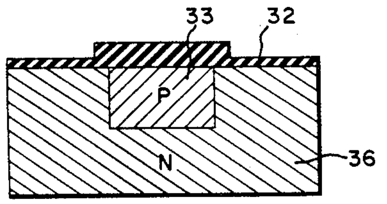
Figure 3E:
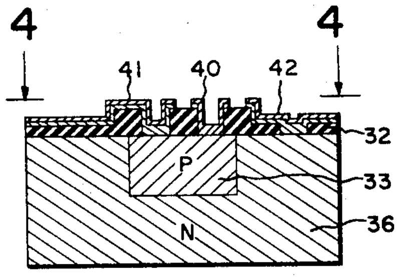
Figure 4:
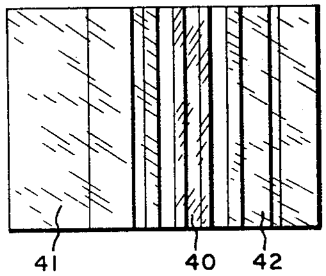
Figure 5A:
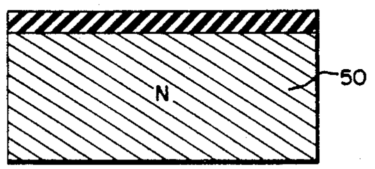
Figure 5B:
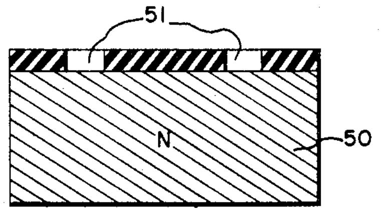
Figure 5C:
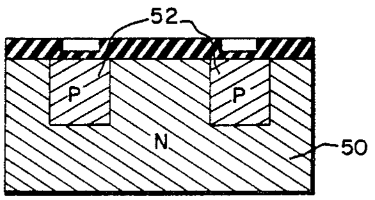
Figure 5D:
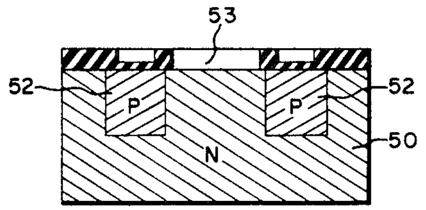
Figure 5E:
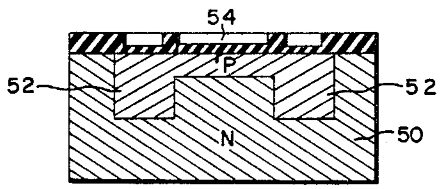
Figure 5F:
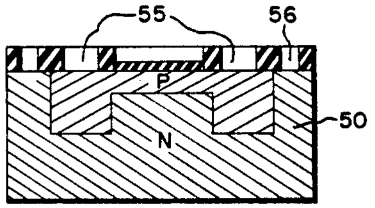
Figure 5G:
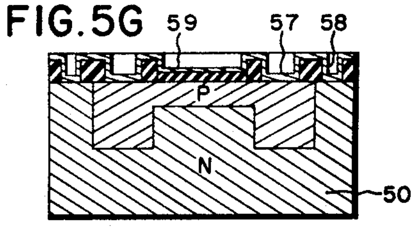
Figure 5H:
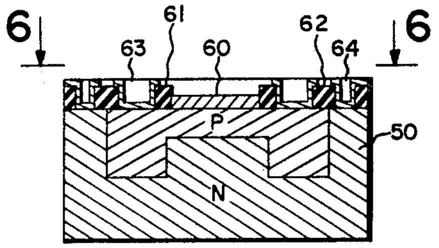
Figure 6:
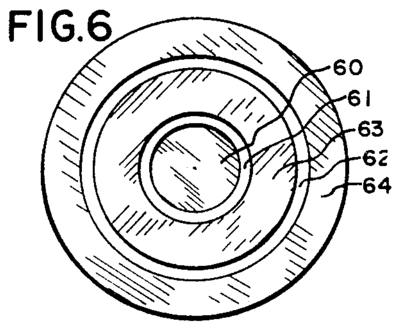

The details of the devices of various embodiments of the invention and the methods for their manufacture will be readily understood from the detailed description which follows, referring to the drawings, in which:

FIGS. 1A–H are a series of cross-sectional views showing the steps in manufacturing a transistor by the method of this invention;

FIG. 2 is a plan view showing the completed transistor of FIG. 1H;

FIGS. 3A–E are a series of cross-sectional views showing the steps in manufacturing a transistor according to the method of another embodiment of the invention;

FIG. 4 is a plan view of the completed transistor of FIG. 3E;

FIGS. 5A–H are a series of cross-sectional views showing the steps in manufacturing a transistor according to the method of still another embodiment of the invention; and FIG. 6 is a plan view of the completed transistor of FIG. 5H.

Referring to FIG. 1, a wafer 1 of semiconductor material (for example, silicon) is prepared, containing P-type and N-type impurities grown simultaneously with the semiconductor crystal by methods well known in the art. One pair of impurities often employed for this purpose is gallium and phosphorous. Since gallium (the P-type impurity) outdiffuses at a faster rate than phosphorous (N-type), it should be present in substantially higher initial concentration to yield the desired final doping level.

Wafer 1 is then heated to induce outdiffusion. For outdiffusion of gallium or aluminum, for example, air, oxygen, water vapor, or other well-known oxidizing atmospheres may be selected; for outdiffusion of gallium, hydrogen is added to the oxidizing agent in the vapor. A layer of oxide 2 (FIG. 1B) will form upon the wafer surface—actually, it forms on all sides of the wafer, but is shown here only on the upper surface because it has no particular use on the remaining surfaces and is generally removed therefrom. Gallium or aluminum will outdiffuse readily through the forming oxide layer; with certain other impurities, presence of the oxide layer may impair outdiffusion, necessitating a vacuum or other inert atmosphere to avoid formation of the oxide layer. This layer may then be formed in a separate step, following the outdiffusion.

The time and temperature required for PN junction 3 to be formed at a desired depth beneath the wafer surface by outdiffusion may be determined empirically. Appropriate figures for various combinations of semiconductor materials and impurities are well known in the art. To insure a high $f_{max.}$, the parameters of the outdiffusion process are so selected as to leave a very small base width (distance between the wafer surface and junction 3), less than about one micron—preferably less than about one-half micron—because the $f_{max.}$ will be inversely proportional to this magnitude.

When outdiffusion is completed, a preponderance of N-type inmpurities will be left in region 4, because that region will have lost most of its P-type impurities. Region 5, however, which will not have outdiffused appreciably, will continue to exhibit substantially P-type conductivity. The area immediately below oxide layer 2 will have the lowest concentration of impurities, since that region will have undergone the heaviest outdiffusion; as the distance from the wafer surface increases, the impurity concentration in upper (N-type) region 4 also increases somewhat.

Outdiffusion will also occur at the lower edge of the wafer (bottom of lower region 5) but since this unnecessary layer of region 5 is generally removed, as by lapping, the portion which remains after lapping will contain a predominance of P-type impurities as in the original wafer.

Next, a photoresist layer (not shown) is applied to the surface of oxide layer 2 to protect that area 6 which is to be retained as a mask (FIG. 1C), and the rest of layer 2 is then removed by a conventional etching solution, such as a buffered solution of hydrofluoric acid. The process of photoetching is well known in the art, and needs no further explanation here.

To extend junction 3 to the surface, a P-type impurity is now diffused into the unprotected upper surface of the wafer surrounding the oxide mask 6. The new P-type diffusant penetrates the semiconductor material and forms a P-type collector region which combines with the original P-type semiconductor material 5 underlying region 4, surrounding the newly-defined N-type base region 7 (FIG. 1D). Junction 3, surrounding region 7, now extends upwards around it on all sides, reaching the wafer surface somewhat under the edge of the raised portion of oxide mask 6 (extensions 8 of the mask are formed by oxidation of the exposed surface of the wafer during the second diffusion).

Again the upper surface is coated with photoresist material (not shown), covering oxide mask 6 and its extensions 8, save for the areas where new apertures 9 and 10 are to be formed (FIG. 1E). A conventional etching solution is used to achieve the structure shown in FIG. 1E. Aperture 9 will be used to form ohmic contact to base region 7 and aperture 10 will form ohmic contact to the extension of collection region 4 formed by the previous diffusion of P-type impurities.

To form the base and contact, a coating of metal, such as gold doped with antimony, is now deposited over the entire surface of the wafer, as by evaporation. The gold layer 11 shown in FIG. 1F adheres to the oxide areas on the wafer surface and to the semiconductor material exposed by apertures 9 and 10. To insure ohmic contact formation, the gold is usually alloyed to the wafer surface by methods known in the art. Such a process is described in co-pending application Ser. No. 823,838, assigned to the same assignee as this invention.

For a P-type base transistor, aluminum may be used for the contact material.

The wafer is then recoated with photoresist except for the area where aperture 12 (FIG. 1G) is to be formed, to serve as the emitter. The aperture is etched through metal layer 11 and oxide layer 6 to expose the surface of base region 7 at its bottom. To etch aperture 12, however, this invention employs a modification of the conventional etching solution containing ions of a metal ranking below the semiconductor material in the electromotive series; these ions will be replaced in the solution by ions of the semiconductor material (e.g., silicon). The displaced metal ions will then form into metallic atoms which will be deposited at the bottom of aperture 12, forming the emitter contact 13 shown in FIG. 1G.

The metal included in the etching solution must meet three criteria: First, in order to plate out onto silicon, it must be below silicon in the electromotive series of the elements. Second, it must form a rectifying barrier on silicon. Third, it must form a barrier of sufficient height so that the injected minority carrier density will be high compared to the majority carrier density so that the emitter efficiency will be high.

For the structure with the N-type base, platinum and rhenium are suitable metals. For a P-type base, there appears to be no metal which meets all these requirements. However, if the processing technique is modified, as hereinafter described, so as to employ evaporation rather than displacement plating, then the first requirement is no longer pertinent and magnesium may be used.

The basic etching solution itself may be a mixture of ammonium fluoride and hydrofluoric acid, or it may be any one of the many standard solutions which will etch through the unmasked oxide coating on the wafer. A small proportion of the solution—e.g., about ten percent by volume—is replaced by an ionic solution of the desired metal: for example, if a platinum contact is desired, about ten percent of the volume of etching solution may be replaced by a platinum tetrachloride solution. Upon immersion of the wafer in the resulting mixture, both metal and oxide layers are removed, forming aperture 12; at the same time, a dot 13 of the pure metal is deposited directly onto the surface of base region 7 at the bottom of the aperture, as shown in FIG. 1G.

Metallic layer 11 now forms a short between base region 7 and collector region 4. Since these regions are normally electrically separated in transistor operation, the process of this invention uses another etching step to remove portions or strips of platinum layer 11 to achieve the structure shown in section in FIG. 1H and from above in FIG. 2. Conventional photoetching is employed for platinum removal, in much the same manner as it was used earlier for oxide removal. Metal dot 13 serves as the emitter contact, metal area 14 as the base contact, and metal area 15 as the collector contact. As is well known in the art, wires may be bonded to these contact areas, if desired, for use in connecting the transistor with external circuitry.

Another embodiment of the invention, shown in FIGS. 3 and 4, may be fabricated in the same manner as the device shown in FIG. 1D; however, in this embodiment the emitter is not deposited during the etching process, but instead is formed by evaporation and deposition which will form a rectifying contact with the semiconductor material, as described above.

Figure 3B:
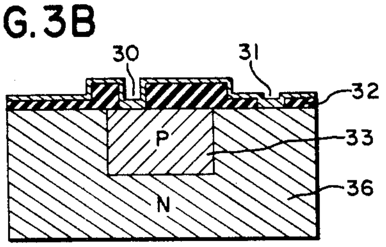

Referring to FIGS. 3A and 3B, apertures 30 and 31 are first etched into oxide layer 32 to receive the base and collector contacts, and a layer of appropriate metal which will form an ohmic contact (such as aluminum or gold) is deposited from a vapor upon the entire wafer surface as shown in FIG. 3B. The vaporized metal will be deposited on both oxide layer 32 and upon the exposed semiconductor material within apertures 30 and 31. To alloy the metal to the wafer, the wafer is generally heated to a temperature greater than the eutectic point of the metal and semiconductor, but lower than the actual melting point of the metal. Ohmic contact 34 is thus formed to base region 33, and ohmic contact 35 formed to collector region 36.

Next, another aperture 37 (FIG. 3C) is etched into the metal and oxide layers to receive the emitter. As noted above, no metal is used with the etching solution in this embodiment; instead, the vaporized metal is deposited directly on the surface of the device after completion of the etching process. A suitable metal (one which forms a rectifying contact with the semiconductor material) is deposited over the entire wafer surface, forming contact 38 on the surface of the semiconductor material at the bottom of aperture 37. This layer of metal 39 is not alloyed, however, and so provides a rectifying contact for the emitter. Aluminum is one example of a metal providing such a contact.

Figure 3C:
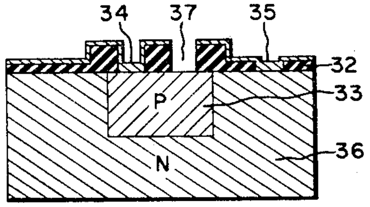
Figure 3D:
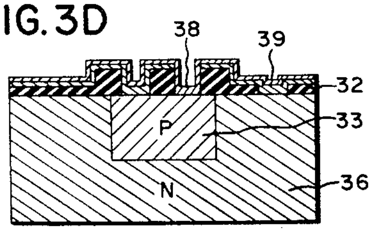

Like the previous embodiment, the device shown in FIG. 3D now has all three of its regions shorted by deposited metal layer 39. To remove the short circuit, portions or strips of layer 39 are now etched away (or otherwise removed) to form the structure shown in FIG. 3E and FIG. 4. Metal layer 40 forms the base contact, layer 41 the emitter contact, and layer 42 the collector contact. The metal of contacts 34 and 35 forms ohmic contacts with the semiconductor material, while the metal of emitter 38 forms a rectifying contact.

Still another embodiment of the invention is shown in FIGS. 5 and 6. In this embodiment the regions underlying the base contacts are diffused more deeply than the region underneath the emitter, to make formation of an alloyed base easier and preclude any possibility of the metal contact shorting through the thin base region into the collector. (It will be recalled that for a high $f_{max.}$ the base width between emitter and collector must be less than one micron—preferably less than one-half micron.) In consequence, when ohmic contacts are being formed to such a very thin region, a very real danger exists that the alloyed metal will pierce through the thin layer of base material and short out the base and collector. The added thickness provided below the base contact by this embodiment reduces this danger without appreciably lessening the $f_{max.}$ of the transistor, because the portion of the base region below the emitter remains thin. The oxide-covered wafer 50 is etched as in FIG. 5B to leave oxide-free apertures 51 and 52 for diffusion therein of the portion of the base to which the base contact adheres (herein called the base ring).

The wafer shown in this embodiment is circular. In the section views of FIG. 5, the base ring appears in two laterally symmetrical places. The wafer is subjected to the diffusion of an oxide-masked impurity of the desired conductivity type (P-type in the illustration). Such an impurity may be boron, aluminum, or indium. Gallium is not useful here, because it penetrates the oxide mask. The time and temperature required for this diffusion to achieve a base ring of the desired depth can be ascertained from standards well known in the art. The ring depth is generally at least one micron, preferably more—e.g., in the neighborhood of five microns—to eliminate any danger of shorting. The resultant base ring 52 is shown in FIG. 5C.

The portion of the base region underlying the emitter in the center of ring 52 is formed separately. For this purpose another aperture 53 (shown in FIG. 5D) is etched into the oxide mask, and impurities of the same conductivity type used for the base ring (P-type in this example) are then diffused into the aperture to form the inner portion of the base region. This second diffusion is carried out at a lower temperature, or for less time than the first (or both); by this means, the depth of inner portion 54 of the base region is made less than the depth of base ring 52, as shown in FIG. 5E. The depth of inner portion 54 is generally less than one micron, preferably less than one-half micron, according to this invention to insure a high $f_{max.}$.

Aperatures 55 and 56 shown in FIG. 5F are next etched into the oxide on the wafer to make a place for the base and collector contacts, respectively. Metal is then deposited over the entire wafer surface in contact with the base region 52 and collector region 50 to form the base and collector contacts. Base contact 57 is formed in aperture 55 and collector contact 58 is formed in aperture 56.

Then the emitter is plated by forming a photoresist mask over the surface except over area 59 and etching the metal and oxide away from area 59 using an etchant solution containing the metal ions, as described above. Finally, the portions of the deposited metal layer are etched away by conventional methods to disconnect the collector and base regions of the device and to insure that the contacts to these regions do not short to emitter 60. The final structure is shown in FIG. 5H and in FIG. 6. Region 61 has the metal removed to avoid base emitter shorts, and region 62 has the metal removed to separate base and collector. Contact 63 is the base contact, and contact 64 is the collector contact.

It will be apparent to one skilled in the art that many modifications can be made in the transistor of this invention and method of its manufacture without departing from the spirit and scope of the invention. Therefore, the invention is limited only as recited in the claims which follow.

What is claimed is:

1. A method of forming a metal rectifying contact to a semiconductor material, which comprises the steps of:

forming an oxide coating on one surface of a body of semiconductor material having impurities therein rendering said body predominantly of one conductivity type, forming an etchant-resistant mask over a portion of said oxide coating, exposing said surface to an etching solution to which said mask is resistant, containing the ions of a metal to be used for said contact, said metal having a work function enabling it to form a rectifying contact with the impurity-containing semiconductor material and being below said semiconductor material in the electromotive series, said etching solution removing the oxide from the unmasked portion of said surface, and said metal ions replacing some of the semiconductor material exposed by the removal of said oxide, thereby leaving a deposit of said metal on said exposed semiconductor material which forms a rectifying contact thereto.

2. A method of forming a metal rectifying contact to silicon, which comprises the steps of:

(a) forming an oxide coating on one surface of a body of silicon having impurities therein rendering said body predominantly of one conductivity type, (b) forming an etchant-resistant mask over a portion of said oxide coating, and (c) exposing said surface to an etching solution to which said mask is resistant, containing the ions of a metal to be used for said contact, said metal having a work function enabling it to form a rectifying contact with the impurity-containing silicon and being below silicon in the electromotive series, said etching solution removing the oxide from the unmasked portion of said surface, and said metal ions replacing some of the silicon exposed by the removal of said oxide, thereby leaving a deposit of said metal on said exposed silicon which forms a rectifying contact thereto.

3. The method of making a transistor, which comprises the steps of:

(a) forming an oxide coating on one surface of a body of semiconductor material containing impurities predominantly of one conductivity type and having a base region diffused therein containing impurities of the opposite conductivity type, said base region coming to the surface of said body beneath said oxide coating, (b) forming an etchant-resistant mask over a first portion of said oxide coating leaving the oxide over a portion of the surface of said base region exposed, (c) exposing said surface to an etching solution to which said mask is resistant containing the ions of a metal having a work function enabling it to form a rectifying contact with the impurity-containing semiconductor material of said base region, and being below said semiconductor material in the electromotive series, said etching solution removing the oxide from the unmasked portion of said surface, and said metal ions replacing some of the semiconductor material exposed by the removal of said oxide, thereby leaving a deposit of said metal on said exposed base region which forms a rectifying contact thereon, (d) exposing a second portion of the surface of said base region by etching away a second portion of said oxide coating thereover, (e) depositing an ohmic contact-forming metal over the entire surface of said body, thereby forming ohmic contact to said base region through said second exposed portion, and to said deposited metal.

(f) removing a portion of said ohmic contact-forming metal over said base region between said rectifying contact and said ohmic contact, said portion selected to electrically separate said ohmic and rectifying contacts, one to be used as the emitter contact and the other to be used as the base contact, and (g) forming a separate ohmic contact with the main body of semiconductor material to serve as the collector contact, thereby completing said transistor.

References Cited

UNITED STATES PATENTS

| | | | |
|---|---|---|---|
| 2,856,320 | 10/1958 | Swanson | 148—1.5 |
| 3,183,128 | 5/1965 | Leistiko | 148—186 |
| 3,241,931 | 3/1966 | Triggs et al. | |

WILLIAM I. BROOKS, *Primary Examiner.*